(12) United States Patent
Miyamoto et al.

(10) Patent No.: US 9,190,397 B2
(45) Date of Patent: Nov. 17, 2015

(54) SEMICONDUCTOR DEVICE

(75) Inventors: Noboru Miyamoto, Tokyo (JP);
Yoshikazu Tsunoda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/359,038

(22) PCT Filed: Feb. 14, 2012

(86) PCT No.: PCT/JP2012/053377
§ 371 (c)(1),
(2), (4) Date: May 16, 2014

(87) PCT Pub. No.: WO2013/121522
PCT Pub. Date: Aug. 22, 2013

(65) Prior Publication Data
US 2015/0179620 A1  Jun. 25, 2015

(51) Int. Cl.
*H01L 23/34* (2006.01)
*H01L 25/16* (2006.01)
(Continued)

(52) U.S. Cl.
CPC ............ *H01L 25/16* (2013.01); *H01L 23/3107* (2013.01); *H01L 23/367* (2013.01); *H01L 23/4334* (2013.01); *H01L 23/4822* (2013.01); *H01L 23/552* (2013.01);
(Continued)

(58) Field of Classification Search
CPC ... H01L 23/3107; H01L 23/28; H01L 23/367; H01L 23/3672; H01L 23/3675; H01L 23/3677; H01L 23/38; H01L 2023/4037; H01L 2023/4043; H01L 2023/405; H01L 2023/4056; H01L 21/4871
See application file for complete search history.

(56) References Cited

U.S. PATENT DOCUMENTS 6,181,718 B1 * 1/2001 Kobayashi et al. ............. 372/34
6,291,880 B1    9/2001 Ogawa et al.
(Continued)

FOREIGN PATENT DOCUMENTS

JP    S60-103852 U    7/1985
JP    H04-030565 A    2/1992
(Continued)

OTHER PUBLICATIONS

International Search Report; PCT/JP2012/053377; Mar. 13, 2012.
(Continued)

*Primary Examiner* — Thanh Y Tran
(74) *Attorney, Agent, or Firm* — Studebaker & Brackett PC

(57) ABSTRACT

A semiconductor element is sandwiched between a lower and upper surface of a cooling body. A connection circuit and a communication device are provided on the lower surface of the cooling body. A drive circuit and a communication device are provided on the upper surface of the cooling body. These components are encapsulated by a resin. The connection circuit generates a control signal in response to a signal from outside. The communication device transmits the control signal. The communication device receives the control signal and supplies the control signal to the drive circuit, which drives the semiconductor element in response to the control signal. The resin electrically insulates the connection circuit and the communication device from the communication device and the drive circuit enabling prevention of breakdown of the connection circuit caused by an application of a high voltage from the drive circuit to the connection circuit.

5 Claims, 1 Drawing Sheet

(51) Int. Cl.
    *H01L 23/433*    (2006.01)
    *H01L 23/552*    (2006.01)
    *H01L 23/31*     (2006.01)
    *H01L 23/367*    (2006.01)
    *H01L 23/482*    (2006.01)
    *H01L 23/495*    (2006.01)

(52) U.S. Cl.
    CPC .................. *H01L 23/49562* (2013.01); *H01L 2224/48091* (2013.01); *H01L 2924/13055* (2013.01); *H01L 2924/3025* (2013.01); *H01L 2924/30107* (2013.01)

(56) References Cited

U.S. PATENT DOCUMENTS

| | | | |
|---|---|---|---|
| 6,822,875 B2* | 11/2004 | Chan et al. | .................. 361/760 |
| 2006/0067059 A1 | 3/2006 | Ushijima et al. | |
| 2008/0007920 A1 | 1/2008 | Shiraki et al. | |
| 2008/0017882 A1 | 1/2008 | Nakanishi et al. | |
| 2008/0130223 A1* | 6/2008 | Nakamura et al. | ............ 361/689 |
| 2012/0133427 A1* | 5/2012 | Kim et al. | .................... 327/564 |

FOREIGN PATENT DOCUMENTS

| | | |
|---|---|---|
| JP | H10-012812 A | 1/1998 |
| JP | H11-233712 A | 8/1999 |
| JP | 2001-250890 A | 9/2001 |
| JP | 2006-042557 A | 2/2006 |
| JP | 2006-093733 A | 4/2006 |
| JP | 2008-016822 A | 1/2008 |
| JP | 2008-027993 A | 2/2008 |
| JP | 2009-064852 A | 3/2009 |
| JP | 2010-129801 A | 6/2010 |
| JP | 4583122 B2 | 9/2010 |

OTHER PUBLICATIONS

Notification of Transmittal of Translation of the International Preliminary Report on Patentability and Translation of Written Opinion of the International Searching Authority; PCT/JP2012/053377; issued on Aug. 28, 2014.

* cited by examiner

SEMICONDUCTOR DEVICE

TECHNICAL FIELD

The present invention relates to a semiconductor device incorporating in one resin package a semiconductor element and a drive circuit for driving the semiconductor element.

BACKGROUND ART

Conventional package-type power modules need gel encapsulation of semiconductor elements. A large number of assembly process steps and high parts cost are required for such power modules. Transfer-molded power modules having semiconductor elements therein are therefore being developed (see, for example, Patent Literature 1). A device having a resin-molded semiconductor package in which a circuit board including a drive circuit for driving a semiconductor element is fixed with screws or the like has been proposed (see, for example, Patent Literature 2).

However, in the case where screws or the like are used, there is a problem in that the number of component parts is increased, which leads to an increased overall weight. There is also a problem in that the device is increased in size by an amount corresponding to the circuit board. Further, in the case of a semiconductor device for use in a motor vehicle, the ambient temperature is high and a semiconductor element such as a SIC heats itself to a high temperature. Therefore, there is a need to use high-temperature-resistant parts, resulting in an increase in manufacturing cost.

For this reason, a semiconductor device has been proposed in which a power semiconductor element and a control semiconductor element for controlling the power semiconductor element are mounted on one cooling body and are encapsulated in resin (see, for example, Patent Literature 3). With this arrangement, a reduction in the number of component parts and a reduction in weight can be achieved, the need for a circuit board such as a printed circuit board can be eliminated, and the control semiconductor element can be cooled.

CITATION LIST

Patent Literature

Patent Literature 1: Japanese Patent Laid-Open No. 2001-250890
Patent Literature 2: Japanese Patent No. 4583122
Patent Literature 3: Japanese Patent Laid-Open No. 2008-27993

SUMMARY OF INVENTION

Technical Problem

The control semiconductor element has a drive circuit for driving the power semiconductor element and a connection circuit for supplying a control signal to the drive circuit in response to a signal from an external ECU. Conventionally, the drive circuit on the high-voltage side and the connection circuit on the low-voltage side are electrically connected to each other. There is, therefore, a possibility of the connection circuit being broken by application of a high voltage from the drive circuit to the connection circuit.

The present invention has been made to solve the above-described problems, and an object thereof is to provide a semiconductor device which can prevent breakdown of the connection circuit.

Means for Solving the Problems

A semiconductor device according to the present invention includes: first and second cooling bodies; a semiconductor element sandwiched between a lower surface of the first cooling body and an upper surface of the second cooling body; a connection circuit provided on the lower surface of the first cooling body and generating a control signal in response to a signal from outside; a drive circuit provided on the upper surface of the second cooling body and driving the semiconductor element in response to the control signal; a first communication device provided on the lower surface of the first cooling body and transmitting the control signal; a second communication device provided on the upper surface of the second cooling body, receiving the control signal transmitted by the first communication device, and supplying the control signal to the drive circuit; and a resin encapsulating portions of the first and second cooling bodies, the semiconductor element, the connection circuit, the drive circuit, and the first and second communication devices and electrically insulating the connection circuit and the first communication device from the second communication device and the drive circuit.

Advantageous Effects of Invention

The present invention makes it possible to prevent breakdown of the connection circuit.

DESCRIPTION OF EMBODIMENTS

Figure 1:
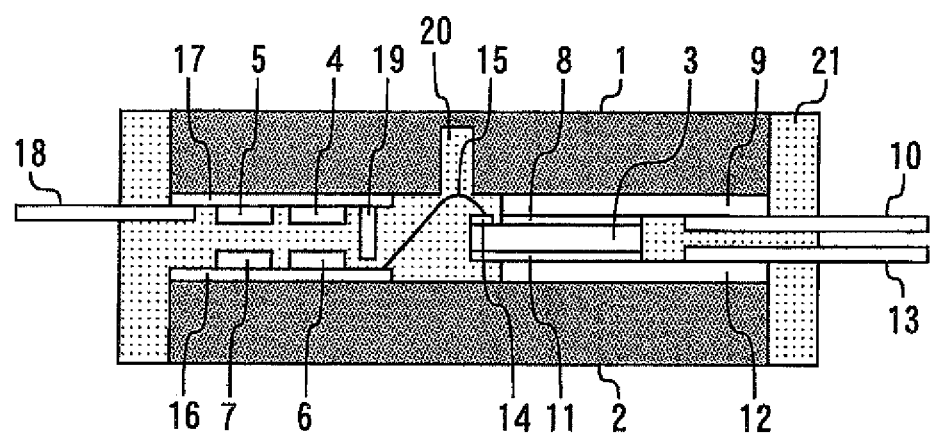
FIG. 1 is a sectional view showing a semiconductor device according to an embodiment of the present invention.

FIG. 1 is a sectional view showing a semiconductor device according to an embodiment of the present invention. This semiconductor device has a double-side cooling structure in which a semiconductor element 3 is sandwiched between a lower surface of a cooling body 1 and an upper surface of a cooling body 2. A connection circuit 4 and a communication device 5 are provided on the lower surface of the cooling body 1, a drive circuit 6 and a communication device 7 are provided on the upper surface of the cooling body 2. The communication devices 5 and 7 are disposed in such positions as to be opposed to each other along the top-bottom direction.

A collector 8 of the semiconductor element 3 is connected to a high-voltage electrode 10 through a circuit pattern 9. An emitter 11 of the semiconductor element 3 is connected to a high-voltage electrode 13 through a circuit pattern 12. A gate 14 of the semiconductor element 3 is connected to the drive circuit 6 through a wire 15 and a circuit pattern 16.

The drive circuit 6 is connected to the communication device 7 through the circuit pattern 16. The communication device 5 is connected to the connection circuit 4 and to a signal electrode 18 through a circuit pattern 17. Each of the communication devices 5 and 7 may be, for example, an optical communication circuit for performing optical communication by means of a light-emitting diode, an optical fiber and a phototransistor, or a magnetic field circuit for performing magnetic communication by means of a coil and a transformer.

An electrically conductive shielding plate 19 is disposed between the semiconductor element 3 and the connection circuit 4 and between the semiconductor element 3 and the drive circuit 6. The shielding plate 19 is connected to the ground of the low-voltage-side circuit pattern 17 to obtain a shielding effect. An insulation distance between the high-voltage-side circuit pattern 9 and the low-voltage-side connection circuit 4 is secured by a groove 20 provided in the lower surface of the cooling body 1.

Portions of the cooling bodies 1 and 2 and components including the semiconductor element 3, the connection circuit 4, the drive circuit 6 and the communication devices 5 and 7 are encapsulated in a resin 21. The resin 21 electrically insulates the connection circuit 4 and the communication device 5 from the communication device 7 and the drive circuit 6. The resin 21 also electrically insulates the projecting end of the shielding plate 19 and the drive circuit 6 from each other. The high-voltage electrodes 10 and 13 and the signal electrode 18 are led out of the resin 21 in opposite directions. The high-voltage electrodes 10 and 13 are disposed parallel to each other.

Figure 2:
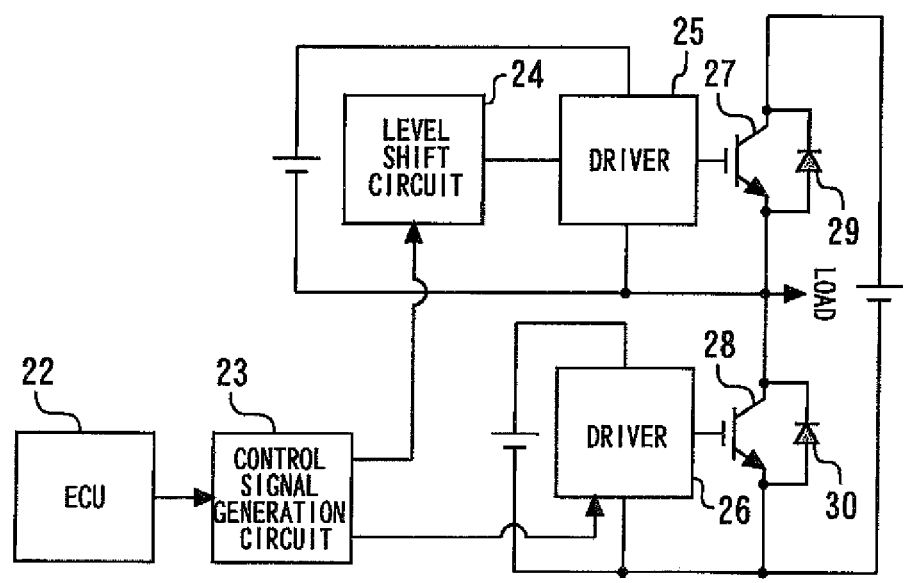
FIG. 2 is a circuit diagram of the semiconductor device according to the embodiment of the present invention.

FIG. 2 is a circuit diagram of the semiconductor device according to the embodiment of the present invention. A control signal generation circuit 23 generates a control signal in response to a signal from an external ECU 22. This control signal is supplied to a driver 25 or to a driver 26 through a level shift circuit 24. The drivers 25 and 26 drive IGBTs 27 and 28, respectively. Diodes 29 and 30 are connected in parallel with the IGBTs 27 and 28, respectively. The control signal generation circuit 23 corresponds to the connection circuit 4 shown in FIG. 1. The drivers 25 and 26 correspond to the drive circuit 6. The IGBTs 27 and 28 and the diodes 29 and 30 correspond to the semiconductor element 3.

The operation of the above-described semiconductor device will now be described. The connection circuit 4 is supplied with a signal from the external ECU through the signal electrode 18 and the circuit pattern 17 and generates a control signal in response to the supplied signal. The communication device 5 transmits this control signal. The communication device 7 receives the control signal and supplies the control signal to the drive circuit 6. The drive circuit 6 drives the semiconductor element 3 in response to the control signal. Through the high-voltage electrodes 10 and 13, the semiconductor element 3 is supplied with a high voltage and outputs a high voltage.

The advantages of the present embodiment will now be described. The resin 21 electrically insulates the connection circuit 4 and the communication device 5 on the low-voltage side from the communication device 7 and the drive circuit 6 on the high-voltage side, thus enabling prevention of breakdown of the connection circuit 4 caused by application of a high voltage from the drive circuit 6 to the connection circuit 4. Also, the semiconductor element 3, the connection circuit 4, the communication devices 5 and 7 and the drive circuit 6 can be cooled by the cooling bodies 1 and 2.

The mount area can be reduced by disposing the communication devices 5 and 7 at such positions that the communication devices 5 and 7 are opposed to each other along the top-bottom direction.

With the shielding plate 19, the connection circuit 4 and the drive circuit 6 can be protected from electromagnetic waves emitted from the semiconductor element 3.

Interference between the high-voltage side and the low-voltage side can be prevented by leading out the high-voltage electrodes 10 and 13 and the signal electrode 18 in opposite directions. An inductance can be reduced by disposing the high-voltage electrodes 10 and 13 parallel to each other.

DESCRIPTION OF SYMBOLS 1 cooling body (first cooling body)
2 cooling body (second cooling body)
3 semiconductor element
4 connection circuit
5 communication device (first communication device)
6 drive circuit
7 communication device (second communication device)
10 high-voltage electrode (first high-voltage electrode)
13 high-voltage electrode (second high-voltage electrode)
18 signal electrode
19 shielding plate
21 resin

The invention claimed is:

1. A semiconductor device comprising:

first and second cooling bodies;

a semiconductor element sandwiched between a lower surface of the first cooling body and an upper surface of the second cooling body;

a connection circuit provided on the lower surface of the first cooling body and generating a control signal in response to a signal from outside;

a drive circuit provided on the upper surface of the second cooling body and driving the semiconductor element in response to the control signal;

a first communication device provided on the lower surface of the first cooling body and transmitting the control signal;

a second communication device provided on the upper surface of the second cooling body, receiving the control signal transmitted by the first communication device, and supplying the control signal to the drive circuit; and a resin encapsulating portions of the first and second cooling bodies, the semiconductor element, the connection circuit, the drive circuit, and the first and second communication devices and electrically insulating the connection circuit and the first communication device from the second communication device and the drive circuit.

2. The semiconductor device according to claim 1, wherein the first and second communication devices perform optical communication or magnetic communication.

3. The semiconductor device according to claim 1, wherein the first and second communication devices are disposed in such positions as to be opposed to each other along a top-bottom direction.

4. The semiconductor device according to claim 1, further comprising an electrically conductive shielding plate disposed between the semiconductor element and the connection circuit and between the semiconductor element and the drive circuit.

5. The semiconductor device according to claim 1, further comprising:

a first high-voltage electrode connected to a collector of the semiconductor element;

a second high-voltage electrode connected to an emitter of the semiconductor element; and a signal electrode connected to the connection circuit, wherein the first and second high-voltage electrodes and the signal electrode are led out of the resin in opposite directions, and the first and second high-voltage electrodes are disposed parallel to each other.

* * * * *